(12) United States Patent
Clabes et al.

(10) Patent No.: US 6,914,764 B2
(45) Date of Patent: Jul. 5, 2005

(54) ON-CHIP THERMAL SENSING CIRCUIT

(75) Inventors: Joachim Gerhard Clabes, Austin, TX (US); Ronald Nick Kalla, Round Rock, TX (US); Stephen Douglas Weitzel, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 10/195,173

(22) Filed: Jul. 11, 2002

(65) Prior Publication Data

US 2004/0008754 A1 Jan. 15, 2004

(51) Int. Cl.$^7$ ................................................ H02H 5/04
(52) U.S. Cl. ........................................................ 361/103
(58) Field of Search ................................ 361/103, 106; 307/310, 651, 117; 702/132, 99; 323/907; 324/760, 677; 327/512, 513

(56) References Cited

U.S. PATENT DOCUMENTS

| | | | | |
|---|---|---|---|---|
| 4,150,573 A | * | 4/1979 | Iinuma et al. ............... 374/185 |
| 4,602,871 A | * | 7/1986 | Hanaoka ...................... 374/102 |
| 4,844,623 A | * | 7/1989 | Wada .......................... 374/171 |
| 4,987,579 A | * | 1/1991 | Yoshinaka et al. ............. 377/25 |
| 5,379,230 A | * | 1/1995 | Morikawa et al. ............. 702/57 |
| 5,388,134 A | * | 2/1995 | Douglass et al. .............. 377/25 |
| 5,485,127 A | | 1/1996 | Bertoluzzi et al. ............ 331/69 |
| 5,508,664 A | * | 4/1996 | Rizzo ......................... 331/111 |
| 5,737,614 A | | 4/1998 | Durham et al. ......... 395/750.04 |
| 5,761,517 A | | 6/1998 | Durham et al. ......... 395/750.04 |
| 5,902,044 A | * | 5/1999 | Pricer et al. ................. 374/112 |
| 5,912,593 A | * | 6/1999 | Susak et al. ................. 331/111 |
| 5,983,339 A | | 11/1999 | Klim ........................... 712/200 |
| 6,029,251 A | * | 2/2000 | Williams et al. ............. 713/501 |
| 6,147,508 A | | 11/2000 | Beck et al. .................... 326/32 |
| 6,412,977 B1 | * | 7/2002 | Black et al. .................. 374/178 |
| 6,417,711 B2 | * | 7/2002 | Fulkerson .................... 327/203 |
| 6,509,803 B2 | * | 1/2003 | Sudou et al. .................. 331/46 |
| 6,695,475 B2 | * | 2/2004 | Yin ............................. 374/171 |

OTHER PUBLICATIONS

Sanchez et al., "Thermal Management System for High Performance PowerPC™ Microprocessors", 1997 IEEE, pp. 325–330.

* cited by examiner

*Primary Examiner*—Brian Sircus
*Assistant Examiner*—James A. Demakis
(74) *Attorney, Agent, or Firm*—Duke W. Yee; Mark E. McBurney; Lisa L. B. Yociss

(57) ABSTRACT

An on-chip thermal sensing circuit is disclosed. The thermal sensing circuit including a detection circuit located on an integrated circuit (IC) for detecting a local temperature of the IC. The output of the thermal sensor has a frequency that is directly related to the local temperature. The detection circuit has an associated time constant that is used to produce the frequency.

15 Claims, 1 Drawing Sheet

ON-CHIP THERMAL SENSING CIRCUIT

BACKGROUND OF THE INVENTION

1. Technical Field

The present invention relates generally to the field of integrated circuits, and, more specifically to an on-chip thermal sensing circuit for measuring the temperature of integrated circuit chips and particularly microprocessor chips.

2. Description of Related Art

It is important to be able to monitor the temperature of an integrated circuit (IC), particularly those implemented using CMOS designs. At higher temperatures, the IC's characteristics change. Circuits get slower, and reliability decreases. Thus, it is important to monitor the temperature of integrated circuits, and in particular microprocessor chips.

It is known in the art for a microprocessor to attempt to manage its temperature by regulating the speed at which it processes. In order to manage its temperature, both external sensors and on-chip sensors have been used.

External sensors are those sensors that are not located on the integrated circuit itself. These sensors are not preferable, however, because they do not provide real-time results and are unable to measure the circuit temperature at the location on the chip of the highest power dissipating circuits.

There have been a number of prior art proposals for on-chip temperature sensing. These proposals include the use of a pair of on-chip thermally response diodes coupled to an off-chip current source. The diode pair generates a differential voltage output that is proportional to temperature. This technique for sensing on-chip temperatures requires numerous connections between the chip and external circuitry for each temperature sensing circuit. Each connection to the chip increases the cost of the product. Small, self contained on-chip temperature sensors have a much lower cost than sensors requiring connections to circuitry external to the chip.

Another prior art design utilizes an on-chip thermal sensor as part of a thermal assist unit. The thermal assist unit consists of three registers, a multiplexer, a latch, a decoder, an interrupt generator, and a thermal logic control block. The thermal sensor circuit utilizes the differential voltage change across two diodes biased at the same operating current, where one diode is larger than the other. For example, the voltage across the larger diode will decrease more quickly than the voltage across the smaller diode when the temperature increases.

It would be desirable to be able to measure localized heating of the chip. Therefore, a need exists for an on-chip thermal sensing circuit that may be replicated throughout the chip.

SUMMARY OF THE INVENTION

An on-chip thermal sensing circuit is disclosed. The thermal sensing circuit including a detection circuit located on an integrated circuit (IC) for detecting a local temperature of the IC. The output of the thermal sensor has a frequency that is directly related to the local temperature. The detection circuit has an associated time constant that is used to produce the frequency.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to the figures, like numerals being used for like and corresponding parts of the accompanying figures.

Figure 1:
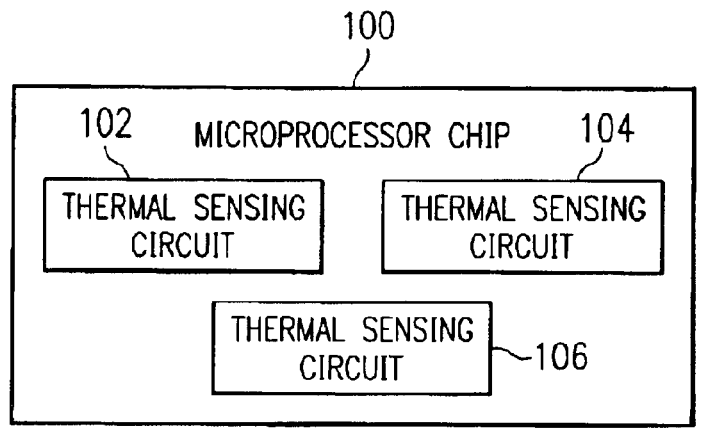
FIG. 1 is a block diagram of a microprocessor chip that includes multiple thermal sensors on the chip in accordance with a preferred embodiment of the present invention.

FIG. 1 is a block diagram of a microprocessor chip that includes multiple thermal sensors on the chip itself in accordance with a preferred embodiment of the present invention. Multiple thermal sensor circuits may be included on an integrated circuit, such as microprocessor chip 100. For example, thermal sensing circuits 102, 104, and 106 may be included in various locations on chip 100. Each thermal sensor will detect and monitor a local temperature of the chip. The thermal sensors are small and require little power and therefore may be included throughout the chip.

Figure 2:
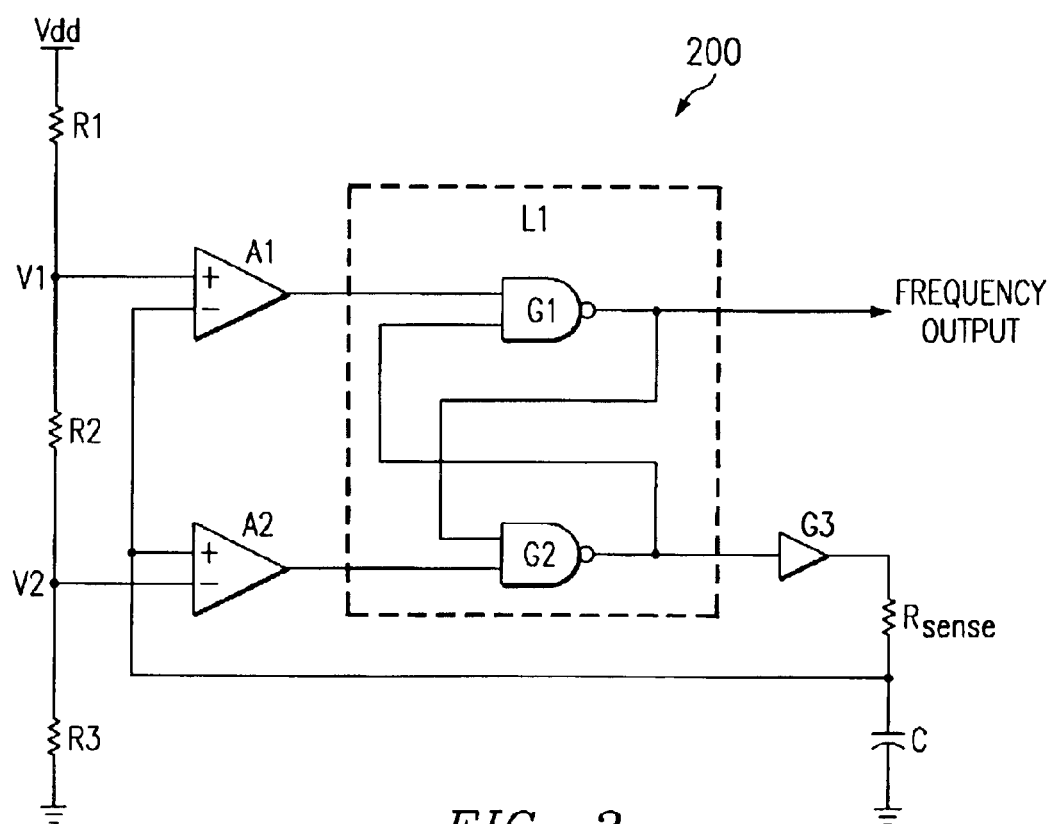
FIG. 2 is a schematic diagram of a circuit that is used as one of the thermal sensors of FIG. 1 in accordance with the present invention.

FIG. 2 is a schematic diagram of a circuit 200 that is used as one of the thermal sensors 102, 104, or 106 of FIG. 1 in accordance with the present invention. Thermal sensing circuit 200 is based on the temperature coefficient of an on-chip resistor $R_{sense}$ which can be composed of metal wire resistance, poly-silicon resistance, silicon diffusion resistance, or a combination of all three resistances. The resistance change of $R_{sense}$ is converted to a frequency change through an RC time constant as described below.

Circuit 200 is an astable multivibrator circuit which produces a logical output signal at a frequency determined by the RC time constant of $(R_{sense})(C)$ and the voltages V1 and V2 established by the voltage divider circuit that includes R1, R2, and R3. Circuits A1 and A2 are analog comparator circuits that produce a logic high level when the voltage at the first input, labeled "+", is greater than the voltage at the second input, labeled "−", and provides a logic low level signal when the voltage at the first input is less than the voltage at the second input. Logic gates G1 and G2 are two input logical NAND gates wired together to form a simple set/reset latch L1. Logic gate G3 is a buffer circuit which buffers logic high and logic low levels to an RC circuit $R_{sense}$ and C which are connected in series.

Once circuit 200 has achieved its operating state, initially, the voltage across capacitor C will be a little higher than voltage V2 with analog comparator circuits A1 and A2 providing a logic high level output signal. The output of logic gate G2 is a logic high level, and the output of logic gate G1 is a logic low level. The output of logic gate G3 is thus a logic high level causing the voltage across capacitor C to increase at a rate determined by the $(R_{sense})(C)$ time constant.

When the voltage across capacitor C reaches or exceeds voltage V1, analog comparator circuit A1 output changes from a logic high level to a logic low level causing logic gate G1 output to change from a logic low level to a logic high level. This in turn causes the output of logic gate G2 to change from a logic high level to a logic low level which in turn causes the output of logic gate G3 to change from a logic high level to a logic low level. The logic low level on the output of G3 causes the voltage to decrease on capacitor C at a rate determined by the $(R_{sense})(C)$ time constant. As the voltage across capacitor C decreases to, or slightly below, voltage V1, analog comparator circuit A1 changes output voltage from a logic low level to a logic high level. The outputs of logic gates G1, G2, and G3 remain unchanged.

When the voltage across capacitor C reaches or is slightly below voltage V2, analog comparator circuit A2 changes from a logic high level to a logic low level which in turn changes the output of logic gate G2 from a logic low level to a logic high level. The logic high level on the output of logic gate G2 causes the output of logic gate G1 to change from a logic high level to a logic low level and also causes the output of logic gate G3 to change from a logic low level to a logic high level. The logic high level of the output of logic gate G3 causes the voltage to increase on capacitor C at a rate determined by the $(R_{sense})(C)$ time constant. When the voltage across capacitor C is equivalent to or exceeds voltage V2, the output of analog comparator circuit A2 changes from a logical low level to a logical high level. The outputs of logic gates G1, G2, and G3 remain unchanged.

As the temperature on the chip changes, so will the resistance of resistor $R_{sense}$ which in turn causes the $(R_{sense})(C)$ time constant of the circuit to change. The frequency output will change as the chip temperature changes. The frequency change will be directly proportional to the resistor change which is directly proportional to the local chip temperature change.

The frequency output signal of logic gate G1 may be used to regulate the chip temperature. This output signal may be provided as an input into a power management circuit, such as power management circuit 34 described in U.S. Pat. No. 5,485,127 which is hereby incorporated by reference in its entirety. The present invention could be used as the temperature sensor 32 of U.S. Pat. No. 5,485,127.

Circuit 200 is inherently self-starting. There are three possible initial conditions of circuit 200 prior to the circuit achieving its operating state. For example, if the initial condition is such that the voltage across capacitor C is less than V2, then comparator circuit A2 will provide a logic low level to logic gate G2, while comparator circuit A1 will provide a logic high level to logic gate G1. The logic low level at the input of logic gate G2 results in a logic high level at the output of logic gate G2 which in turn causes the output of logic gate G3 to be a logic high level. The logic high level at the output of logic gate G3 causes the voltage across capacitor C to increase at a rate determined by the $(R_{sense})(C)$ time constant. When the voltage across capacitor C reaches or exceeds voltage V2, analog comparator circuit A2 output changes from a logic low level to a logic high level. The output of logic gate G2 and G3 does not change. When the voltage across capacitor C reaches or exceeds voltage V1, analog comparator circuit A1 output changes from a logic high level to a logic low level causing logic gate G1 output to change from a logic low level to a logic high level. The circuit has now achieved its operating state. It should be noted that the clock period for the initial clock cycle will not be equivalent to succeeding clock periods due to this initial voltage requiring addition time for capacitor C to charge to voltage V1.

A second initialization case is when the initial voltage across capacitor C is greater than V1. For this start up case, comparator A1 will provide a logic low level to logic gate G1, while comparator circuit A2 will provide a logic high level to logic gate G2. The logic low level at the input of logic gate G1 results in a logic high level at the output of logic gate G1, providing a logic high level at the input of logic gate G2. The two logic high level signals at the inputs of logic gate G2 cause the output of logic gate G2 to be a logic low level, which in turn causes the output of logic gate G3 to be a logic low level. The logic low level on the output of G3 causes the voltage to decrease across capacitor C at a rate determined by the $(R_{sense})(C)$ time constant. The voltage across capacitor C will decrease. When the voltage across capacitor C is less than V1, the output voltage of comparator A1 will change to a logic high level. The output of logic gates G1, G2 and G3 does not change. The voltage across capacitor C continues to decrease until the voltage becomes equal or slightly lower than V2, which causes the output of comparator A2 to change to a logic low level. The circuit has now achieved its operating state. It should be noted that the clock period for the initial clock cycle will not be equivalent to succeeding clock periods due to this initial voltage requiring additional time for capacitor C to discharge to voltage V2.

A third case to consider is when the voltage across capacitor C is between voltage V1 and V2. For this case, the output logic level of G2 determines whether the voltage across capacitor C will initially increase or decrease. The output voltage of both comparators A1 and A2 is a logic high level. If the output logic level of logic gate G2 is a logic low level, the voltage across capacitor C will initially decrease until the voltage drops slightly below V2. This causes the output voltage of comparator A2 to become a logic low level which in turn causes the output of logic gate G2 to become a logic high level. This causes the output of logic gate G3 to become a logic high level switch causes the voltage across capacitor C to increase. The circuit then operates as described above. If the initial condition is logic high level at the output of logic gate G2, the voltage across capacitor C initially increases until the voltage rises slightly above V1. This causes the output voltage of comparator A1 to become a logic low level which in turn causes a logic high level at the output of logic gate G2. The logic high level of gate G1 output and logic high level of comparator A2 output causes the output of logic gate G2 to switch to a logic low level which in turn causes the output of logic gate G3 to switch to a logic low level. The logic low level output of G3 causes the voltage across capacitor C to decrease at a rate determined by the $(R_{sense})(C)$ time constant. The circuit then operates as described above.

Those skilled in the art will recognize that this circuit can be modified by removing analog comparator circuit A2 and logic gates G1 and G2, and by replacing the connection between the first input of A1 and V1 with two orthogonally switched circuits, such that a first switch is connected between the first input of A1 and V1 and a second switch is connected between the first input of A1 and V2. When the output of analog comparator A1 is a logic high level, the first switch is closed and the second switch is open. When the output of analog comparator A1 is a logic low level, the first switch is opened and the second switch is closed. The output of analog comparator A1 is connected to the input of logic gate G3. The circuit of this embodiment will operate similarly as described above with the voltage across capacitor C alternately increasing and decreasing between voltages V1 and V2.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An on-chip thermal sensing circuit comprising:
   a detection circuit located on an integrated circuit (IC) for detecting a focal temperature of said IC;
   an output of said thermal sensing circuit having a frequency, said frequency being directly related to said local temperature;
   said detection circuit including a capacitor and a sensing resistor, a resistance of said sensing resistor varying in direct proportion to said local temperature of said IC;
   a voltage divider for producing a first voltage and a second voltage;
   a first comparator producing a first output and having a first input and a second input, said first input being coupled to said first voltage and said second input being a current value of a voltage across said capacitor;
   a second comparator producing a second output and having a first input and a second input, said first input being said current value of said voltage across said capacitor and said second input being coupled to said second voltage; and
   a latch receiving as its inputs said first output and said second output and producing said output and a third output, said third output being coupled to said detection circuit.

2. The thermal sensing circuit according to claim 1, further comprising:
   said detection circuit having an associated time constant; and
   said time constant being utilized to produce said frequency.

3. The thermal sensing circuit according to claim 1, further comprising:
   said thermal sensing circuit being an astable multivibrator that produces said output.

4. The thermal sensing circuit according to claim 1, further comprising:
   said thermal sensing circuit detecting said local temperature, said local temperature being equal to a first temperature;
   said output having said frequency whereby said frequency is equal to a first frequency;
   said local temperature changing to be equal to a second temperature; and
   said output having said frequency whereby said frequency changes to become equal to a second frequency.

5. The thermal sensing circuit according to claim 1, further comprising:
   a latch coupled to said detection circuit, said latch producing said output.

6. A method for measuring the temperature of an integrated circuit utilizing a thermal sensing circuit, said method comprising the steps of:
   providing a detection circuit located on said integrated circuit (IC) for detecting a local temperature of said IC;
   generating an output of said thermal sensing circuit having a frequency, said frequency being directly related to said local temperature;
   including a capacitor and a sensing resistor in said detection circuit;
   detecting, utilizing said detection circuit, a variation of a resistance of said sensing resistor, said resistance varying in direct proportion to said local temperature of said IC;
   producing a first voltage and a second voltage utilizing a voltage divider;
   receiving within a first comparator a first input and a second input, said first comparator producing a first output, said first input being coupled to said first voltage and said second input being a current value of a voltage across said capacitor;
   receiving within a second comparator a first input and a second input said second comparator producing a second output, said first input being said current value of said voltage across said capacitor and said second input being coupled to said second voltage;
   receiving within a latch as its inputs said first output and said second output and producing said output and a third output, said third output being coupled to said detection circuit; and
   said detection circuit vibrating between said first and second voltage in direct relationship to a time constant of said sensing resistance and capacitor, wherein said vibration produces said frequency of said output.

7. The method according to claim 6, further comprising the steps of:
   associating a time constant with said detection circuit; and
   utilizing said time constant to produce said frequency.

8. The method according to claim 6, further comprising the steps of:
   detecting said local temperature utilizing said thermal sensing circuit, said local temperature being equal to a first temperature;
   generating said output, wherein said frequency of said output is equal to a first frequency;
   said local temperature changing to be equal to a second temperature; and
   changing said output, wherein said frequency of said output changes to become equal to a second frequency.

9. The method according to claim 6, further comprising the steps of:
   including a latch in said thermal sensing circuit, said latch being coupled to said detection circuit, said latch producing said output.

10. The method according to claim 6, further comprising the steps of:
    said detection circuit having a time constant that is equal to a value of said capacitor multiplied by a current value of said sensing resistor;
    varying said resistance of said sensing resistor in direct proportion to a variance of said local temperature of said IC, whereby said time constant varies in direct proportion to said variance of said local, temperature;
    providing a first voltage and a second voltage; and
    said detection circuit vibrating between said first and second voltage in direct proportion to said time constant, wherein said vibration produces said frequency of said output.

11. An apparatus for measuring a plurality of different local temperatures within an integrated circuit, said apparatus comprising:
    a plurality of separate thermal sensing circuits distributed throughout within said integrated circuit;

each one of said plurality of thermal sensing circuits detecting a different one of said plurality of different local temperatures; and each one of said plurality of thermal sensing circuits including:
an output of one of said plurality of thermal sensing circuits having a frequency, said frequency being directly related to said local temperature that is detected by said one of said plurality of thermal sensing circuits;
a detection circuit;
said detection circuit including a capacitor and a sensing resistor, a resistance of said sensing resistor varying in direct proportion to said local temperature that is detected by said one of said plurality of thermal sensing circuits that includes said detection circuit;

each one of said plurality of thermal sensing circuits including;
a voltage divider for producing a first voltage and a second voltage;
a first comparator producing a first output and having a first input and a second input, said first input being coupled to said first voltage and said second input being a current value of a voltage across said capacitor;
a second comparator producing a second output and having a first input and a second input, said first input being said current value of said voltage across said capacitor and said second input being coupled to said second voltage; and
a latch receiving as its inputs said first output and said second output and producing said output and a third output, said third output being coupled to said detection circuit.

12. The apparatus according to claim 11, further comprising:
a latch circuit included in each one of said plurality of thermal sensing circuits, said latch circuit coupled to said detection circuit, said latch circuit producing said output.

13. The apparatus according to claim 11, further comprising:
said detection circuit vibrating between said first and second voltage in direct relationship to a time constant of said sensing resistance and capacitor, wherein said vibration produces said frequency of said output.

14. A method for measuring the temperature of an integrated circuit utilizing a thermal sensing circuit, said method comprising the steps of:
providing a detection circuit located on said integrated circuit (IC) for detecting a local temperature of said IC;
generating an output of said thermal sensing circuit having a frequency, said frequency being directly related to said local temperature;
including a capacitor and a sensing resistor in said detection circuit, a resistance of said sensing resistor varying in direct proportion to a temperature of said IC;
producing a first voltage and a second voltage utilizing a voltage divider;
receiving within a first comparator a first input and a second input, said first comparator producing a first output, said first input being coupled to said first voltage and said second input being a current value of a voltage across said capacitor;
receiving within a second comparator a first input and a second input, said second comparator producing a second output, said first input being said current value of said voltage across said capacitor and said second input being coupled to said second voltage;
receiving within a latch as its inputs said first output and said second output and producing said output and a third output, said third output being coupled to said detection circuit; and
said detection circuit vibrating between said first and second voltage in direct relationship to a time constant of said sensing resistance and capacitor, wherein said vibration produces said frequency of said output.

15. A method for measuring the temperature of an integrated circuit utilizing a thermal sensing circuit, said method comprising the steps of:
providing a detection circuit located on said integrated circuit (IC) for detecting a local temperature of said IC;
generating an output of said thermal sensing circuit having a frequency, said frequency being directly related to said local temperature;
including a capacitor and a sensing resistor in said detection circuit;
detecting, utilizing said detection circuit, a variation of a resistance of said sensing resistor, said resistance varying in direct proportion to said local temperature of said IC;
said detection circuit having a time constant that is equal to a value of said capacitor multiplied by a current value of said sensing resistor;
varying said resistance of said sensing resistor in direct proportion to a variance of said local temperature of said IC, whereby said time constant varies in direct proportion to said variance of said local temperature;
providing a first voltage and a second voltage; and
said detection circuit vibrating between said first and second voltage in direct proportion to said time constant, wherein said vibration produces said frequency of said output.

* * * * *

UNITED STATES PATENT AND TRADEMARK OFFICE
CERTIFICATE OF CORRECTION

PATENT NO. : 6,914,764 B2
DATED : July 5, 2005
INVENTOR(S) : Clabes et al.

It is certified that error appears in the above-identified patent and that said Letters Patent is hereby corrected as shown below:

Column 5,
Line 11, after "detecting" delete "focal" and insert -- local --.

Column 6,
Line 15, after "input" insert -- , --.
Line 55, after "local" delete ",".

Signed and Sealed this

Second Day of May, 2006

JON W. DUDAS
*Director of the United States Patent and Trademark Office*